(12) United States Patent
Bakker et al.

(10) Patent No.: US 6,838,684 B2
(45) Date of Patent: Jan. 4, 2005

(54) LITHOGRAPHIC PROJECTION APPARATUS AND PARTICLE BARRIER FOR USE THEREIN

(75) Inventors: Levinus Pieter Bakker, Helmond (NL); Frank Jeroen Pieter Schuurmans, Valkenswaard (NL); Vadim Yevgenyevich Banine, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/644,954

(22) Filed: Aug. 21, 2003

(65) Prior Publication Data

US 2004/0108465 A1 Jun. 10, 2004

(30) Foreign Application Priority Data

Aug. 23, 2002 (EP) .......................................... 02078515

(51) Int. Cl.⁷ ............................................... G21G 5/00
(52) U.S. Cl. ............................. 250/492.2; 250/504 R; 250/365; 250/461.1
(58) Field of Search ................ 378/34, 119; 250/492.2; 355/67; 359/366, 857

(56) References Cited

U.S. PATENT DOCUMENTS

| | | | |
|---|---|---|---|
| 4,408,338 A | | 10/1983 | Grobman |
| 6,262,796 B1 | | 7/2001 | Loopstra et al. |
| 6,359,969 B1 | | 3/2002 | Shmaenok |
| 6,576,912 B2 | * | 6/2003 | Visser et al. ............. 250/492.2 |
| 6,594,334 B1 | | 7/2003 | Ota |
| 6,683,936 B2 | * | 1/2004 | Jonkers ...................... 378/34 |
| 2002/0084428 A1 | * | 7/2002 | Visser et al. ............. 250/492.2 |
| 2002/0090054 A1 | | 7/2002 | Sogard |
| 2002/0154279 A1 | | 10/2002 | Koster et al. |
| 2003/0020890 A1 | | 1/2003 | Miyake et al. |
| 2003/0095623 A1 | | 5/2003 | Singer et al. |
| 2003/0146391 A1 | * | 8/2003 | Kleinschmidt et al. ...... 250/372 |
| 2004/0094724 A1 | * | 5/2004 | Schuurmans et al. ..... 250/492.2 |
| 2004/0141165 A1 | * | 7/2004 | Zukavishvili et al. ......... 355/53 |
| 2004/0165171 A1 | * | 8/2004 | Tran et al. .................... 355/71 |

FOREIGN PATENT DOCUMENTS

| | | |
|---|---|---|
| JP | 2000-349009 | 12/2000 |
| WO | WO 01/79936 A1 * | 10/2001 |

OTHER PUBLICATIONS

Partlo et al., "Development of an EUV (13.5nm) Light Source Employing a Dense Plasma Focus in Lithium Vapor," *Proc. of SPIE* vol. 3997:136–156, Emerging Lithographic Technologies IV, ed. E. Dobisz (Mar. 2000).

McGeoch, "Power Scaling of a Z–Pinch Extreme Ultraviolet Source," *Proc. of SPIE* vol. 3997:861–866, Emerging Lithographic Technologies IV, ed. E. Dobisz (Mar. 2000).

* cited by examiner

*Primary Examiner*—Nikita Wells
*Assistant Examiner*—Johnnie L Smith, II
(74) *Attorney, Agent, or Firm*—Pillsbury Winthrop LLP

(57) ABSTRACT

A lithographic projection apparatus for EUV lithography includes a foil trap. The foil trap forms an open structure after the EUV source to let the EUV radiation pass unhindered. The foil trap is configured to be rotatable around an optical axis. By rotating the foil trap, an impulse transverse to the direction of propagation of the EUV radiation can be transferred on debris present in the EUV beam. This debris will not pass the foil trap. In this way, the amount of debris on the optical components downstream of the foil trap is reduced.

15 Claims, 3 Drawing Sheets

LITHOGRAPHIC PROJECTION APPARATUS AND PARTICLE BARRIER FOR USE THEREIN

RELATED APPLICATION

This application claims the benefit of priority to European Patent Application No. 02078515.0, filed Aug. 23, 2002, the contents of which are herein incorporated by reference.

BACKGROUND OF THE INVENTION

1. Field of the Invention

The present invention relates to a lithographic projection apparatus and a particle barrier for use therein.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In a lithographic apparatus, the size of features that can be imagined onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range 5 to 20 nm, especially around 13 nm. Such radiation is termed extreme ultraviolet (EUV) or soft x-ray and possible sources include, for example, laser-produced plasma sources, discharge plasma sources, or synchrotron radiation from electron storage rings. Apparatus using discharge plasma sources are described in: W. Partlo, I. Fomenkov, R. Oliver, D. Birx, "Development of an EUV (13.5 nm) Light Source Employing a Dense Plasma Focus in Lithium Vapor", Proc. SPIE 3997, pp. 136–156 (2000); M. W. McGeoch, "Power Scaling of a Z-pinch Extreme Ultraviolet Source", Proc. SPIE 3997, pp. 861–866 (2000); W. T. Silfvast, M. Klosner, G. Shimkaveg, H. Bender, G. Kubiak, N. Fornaciari, "High-Power Plasma Discharge Source at 13.5 and 11.4 nm for EUV lithography", Proc. SPIE 3676, pp. 272–275 (1999); and K. Bergmann et al., "Highly Repetitive, Extreme Ultraviolet Radiation Source Based on a Gas-Discharge Plasma", Applied Optics, Vol. 38, pp. 5413–5417 (1999).

EUV radiation sources, such as discharge plasma radiation sources referred to above, may require the use of a rather high partial pressure of a gas or vapor to emit EUV radiation. In a discharge plasma source, for example, a discharge is created in between electrodes, and a resulting partially ionized plasma may subsequently be caused to collapse to yield a very hot plasma that emits radiation in the EUV range. The very hot plasma is quite often created in Xe, since a Xe plasma radiates in the extreme UV (EUV) range around 13.5 nm. For an efficient EUV production, a typical pressure of 0.1 mbar is required near the electrodes to the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore required to confine the rather high Xe pressure to a limited region around the source. To achieve this the source can be contained in its own vacuum chamber that is separated by a chamber wall from a subsequent vacuum chamber in which the collector mirror and illumination optics may be obtained.

The vacuum wall can be made transparent to EUV radiation by a number of apertures in the wall provided by a channel array or so called foil trap, such as described in U.S. Pat. No. 6,359,969. In order to reduce the number of particles propagating along the optical axis, a channel array or "foil trap" has been proposed in U.S. Patent Application Publication 2002/0,154,279 A1 and U.S. Pat. No. 6,359,969, both of which are incorporated herein by reference in their entirety. This foil trap consists of a channel like structure comprising lamella shaped walls close together in order to form a flow resistance, but not too close as to let the radiation pass without obstructing it.

The contamination of the optical components of the lithography apparatus by relatively heavy, micron-sized particles or smaller particles having a relatively low velocity, which are emitted by the EUV source and which pass the channel array in the vacuum wall of the source poses a serious problem, as this contamination results in degradation of the optical components and considerably increases the operational costs of an EUV lithographic projection apparatus.

SUMMARY OF THE INVENTION

It is therefore an aspect of the present invention to reduce the number of particles or eliminate the particles that are emitted by the EUV source and that propagate along the optical axis.

It is another aspect to reduce the amount of contamination caused by the EUV source on optical components in an EUV lithographic projection apparatus.

This and other aspects are achieved according to the present invention in a lithographic projection apparatus including a radiation system configured to form a projection beam of radiation from radiation emitted by a radiation source, a support configured to hold a patterning device which is to be irradiated by the projection beam to pattern the projection beam, a substrate table configured to hold a substrate, a projection system configured to image an irradiated portion of the patterning device onto a target portion of the substrate, and a channel barrier near the radiation source configured to prevent material emanating from the radiation source from propagating along an optical axis, the channel barrier including a center and a number of elongated channel members each having a width direction transverse to the optical axis and a length direction extending generally in the direction of the optical axis, wherein the channel barrier is rotatable around the optical axis, and the lithographic projection apparatus includes a drive connected to the channel barrier configured to rotate the channel barrier around the optical axis. By rotating the channel barrier, particles emitted from the EUV source and travelling along the optical axis are intercepted by the walls of the channel barrier which travel perpendicular to the optical axis and will stick there. In this way, the delicate optical components behind the channel barrier will be guarded against contamination.

In an embodiment of a lithographic projection apparatus according to the present invention, the channel members are focussed on the radiation source. EUV rays of radiation emitted from the EUV source may pass the channel barrier without substantial obstruction. This is an important advantage because EUV radiation tends to be absorbed very easily.

The velocity of the heavy particles, such as debris including ablate, evaporated or sputtered electrode material emanating from the source, is relatively low. From experiments, the speeds appear to be lower than 10 m/s. The aspect ratio of the channel members in the channel barrier (length/width ratio) is in the order of 20. When the channel barrier is rotated at a velocity of 10/20=0.5 m/s, virtually all the heavy particles emitted by the EUV source will hit the channel member walls and will be trapped in the walls.

In a further embodiment of the present invention, the lithographic projection apparatus includes a drive adapted to rotate the channel barrier at a speed of between 1 and 50 rotations per second, preferably between 1 and 10 rotations per second. These relatively low rotational velocities can be easily accomplished and no specialized, advanced and complex components are necessary.

According to another embodiment of the present invention, a supplementary channel barrier is rotatably mounted with respect to the optical axis near the channel barrier, wherein the supplementary channel barrier has a direction of rotation opposite to the direction of rotation of the channel barrier. If some fast moving contaminating particles pass one of the channel members at a certain angle, they almost certainly will not pass the next channel member of the supplementary channel barrier because the angle of the next channel member relative to the particles will be different.

Similar effects can be achieved in an embodiment according to the present invention wherein the supplementary channel barrier has substantially the same direction of rotation as the direction of rotation of the channel barrier, and has a rotational velocity different from the rotational velocity of the channel means, or even wherein the supplementary channel barrier is non-rotationally mounted.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
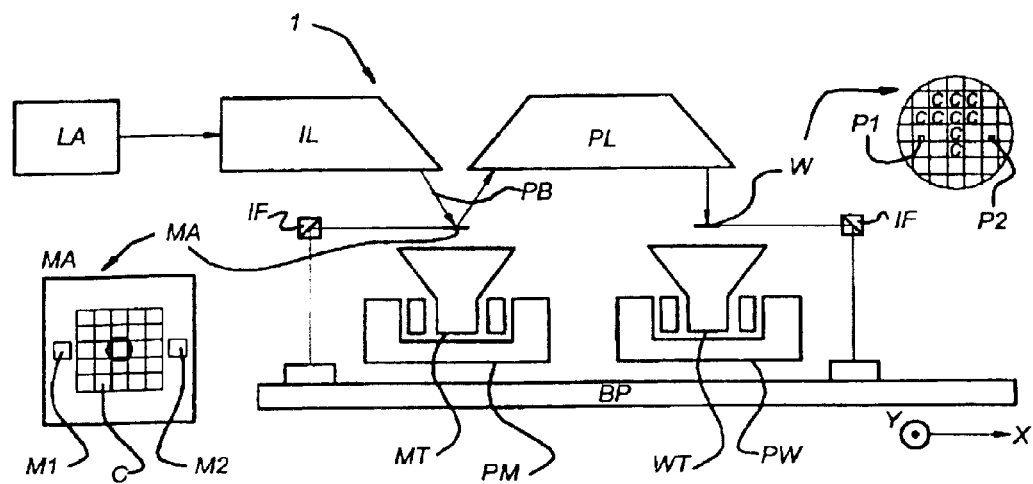
FIG. 1 schematically depicts a lithographic projection apparatus according to an embodiment of the present invention.

FIG. 1 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander, for example. The illuminator IL may comprise an adjusting device configured to set the outer and/or inner radial extent (commonly referred to as σ-outer and σ-inner, respectively) of the intensity distribution in the projection beam PB. In addition, it will generally comprise various other components, such as an integrator and a condenser. In this way, the projection beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

1. The depicted apparatus can be used in two different modes: In step mode, the mask table MT is kept essentially stationary, and an entire mask image is projected at once, i.e. a single "flash,"onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
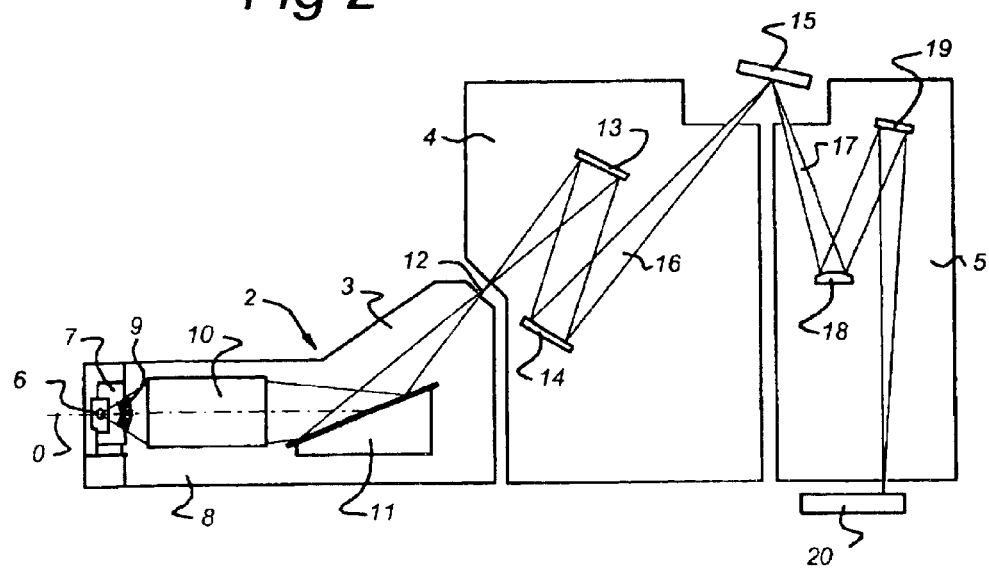
FIG. 2 shows a side view of an EUV illuminating system and projection optics of a lithographic projection apparatus according to the present invention.

FIG. 2 shows the projection apparatus 1 comprising an illumination system with a source-collector module or radiation unit 3, illumination optics unit 4, and projection optics system 5. A radiation system 2 includes the source-collector module or radiation unit 3 and the illumination optics unit 4. The radiation unit 3 may be provided with an EUV radiation source 6 which may be formed by a discharge plasma. The EUV radiation source 6 may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe, Li vapor or any other suitable gas or vapor may be required for efficient generation of the radiation. The radiation emitted by radiation source 6 is passed from the source chamber 7 into collector chamber 8 via a gas barrier or "foil trap" 9. The gas barrier 9 includes a channel structure such as, for example, described in detail in U.S. Patent Application Publication 2002/0,154,279 A1 and U.S. Pat. No. 6,359,969.

The collector chamber 8 includes a radiation collector 10, which according to the present invention, is formed by a grazing incidence collector. Radiation passed by collector 10 is reflected off a grating spectral filter 11 or mirror to be focused in a virtual source point 12 at an aperture in the collector chamber 8. From chamber 8, the projection beam 16 is reflected in illumination optics unit 4 via normal incidence reflectors 13, 14 onto a reticle or mask positioned on reticle or mask table 15. A patterned beam 17 is formed which is imaged in projection optics system 5 via reflective elements 18, 19 onto wafer stage or substrate table 20. More elements than shown may generally be present in illumination optics unit 4 and projection system 5.

Figure 3:
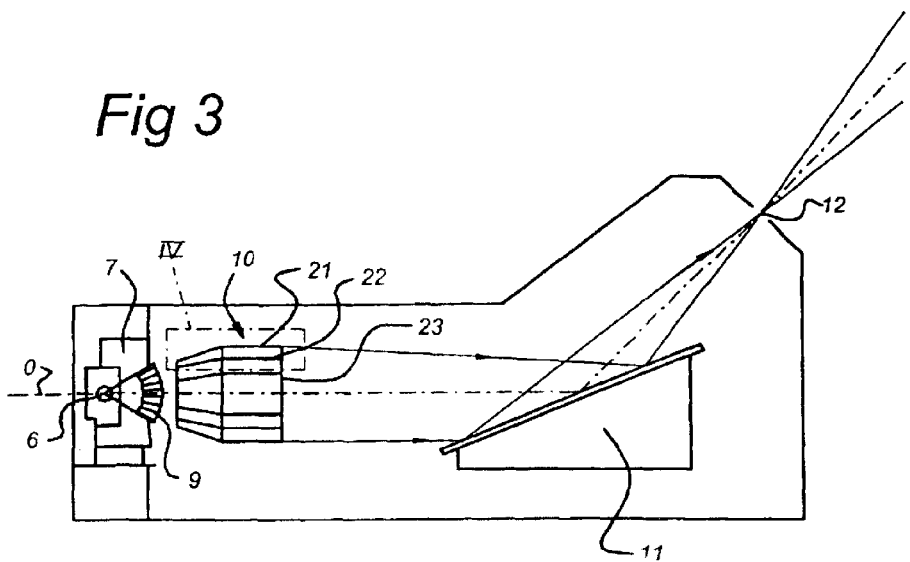
FIG. 3 shows a detail of the radiation source and grazing incidence collector of the present invention.

As can be seen in FIG. 3, the grazing incidence collector 10 comprises a number of nested reflector elements 21, 22, 23. A grazing incidence collector of this type is, for instance, shown in German patent application DE 101 38 284.7, which is equivalent to U.S. Patent Application Publication 2003/0,095,623 A1.

Figure 4:
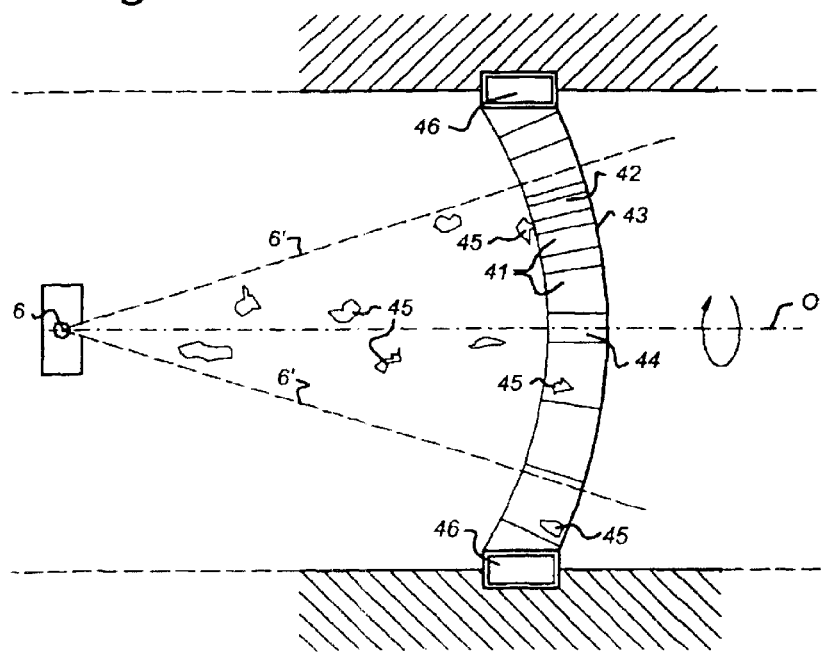
FIG. 4 shows in a cross-section a schematic drawing of the rotating particle barrier according to the present invention.

The embodiment of the rotating channel array or barrier 43 according to the present invention as shown in FIG. 4 shows the EUV source 6 from which EUV radiation beams 6' emanate. The beams 6' impinge on the barrier 43 forming part of a vacuum wall separating the source chamber from the UV optics downstream of the optical axis. The barrier 43 is rotatable around the optical axis O, as indicated by the arrow. It is also possible for the barrier 43 to rotate around the optical axis O in a direction opposite to the direction of the arrow or alternately rotate in one direction or the other. The center 44 of the barrier 43 is located on the optical axis. The barrier 43 may be cylindrically symmetric along an optical axis O. The barrier may also be invariant when rotated over some specific angles only. The barrier 43 comprises a lamellar structure 41. The mutual distance between the different lamellas can vary, as shown, for a segment 42 of the barrier 43. Thus, the distance between consecutive lamellas may vary. The lamellar structure 41 forms, viewed in 3D, small channels. The channels may be focussed on the radiation source 6. It is also possible to construct a channel array 43 without a real focus. The channels are, however, parallel with the emitted EUV beam. The principal idea behind the invention is that contaminating particles 45 in the EUV radiation 6' will, due to rotation of the barrier 43 stick to the inside of the lamellar structure 41 through which the EUV radiation 6' propagates. The barrier 43 is rotatable for instance by a drive 46 located on both sides of the barrier 43, with rotational speeds of about 7 rotations per second. The lamellar structure 41 is focussed on the radiation source. EUV rays of radiation emitted from the EUV source may pass the lamellar structure 41 without obstruction. Typical values for the dimensions of the lamellar structure 41 are: platelets: height 30 mm, thickness 0.1 mm and width 50 mm (curved). A typical value for the channel width is 1 mm. The distance from the barrier 43 to the source 6 is typically in the order of 60 mm.

When the rotation of the foil trap is not synchronized with the pulse frequency of the source, stroboscopic effects can occur. To circumvent stroboscopic effects, the foil trap could be rotated exactly an integer number of channels in between two pulses of the source.

Figure 5:
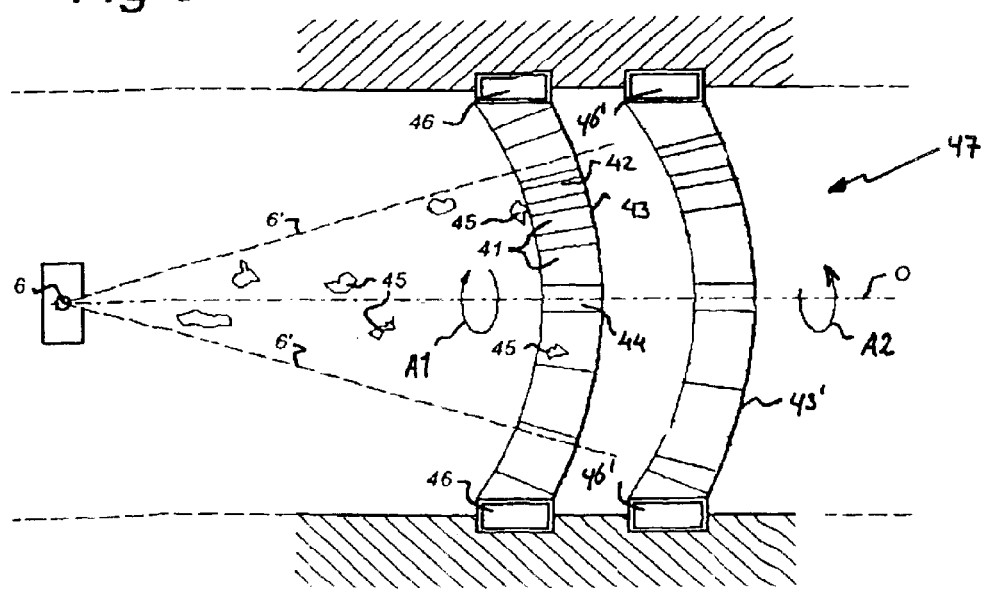
FIG. 5 shows in a cross-section a schematic drawing of two contra-rotating particle barriers according to the present invention.

For those components shown in FIG. 5 having the same reference numeral as corresponding components shown in FIGS. 2–4, reference is made to the description of those figures above, as these components are not described further hereinbelow. FIG. 5 shows a barrier assembly 47 including barriers 43 and 43' driven by separate drives 46 and 46', respectively. In the embodiment shown barriers 43 and 43' rotate in opposite directions, as indicated by arrows A1 and A2, around the optical axis O. This barrier assembly is able to prevent fast moving contaminating particles (thermal or with velocities several times higher than thermal) emanating from the EUV source (or thermalized in the volume between the source and the foil traps) to escape from the source chamber and reach the collector chamber. This may also be achieved by similar barrier assemblies, wherein one barrier 43 is rotating and the other barrier 43' is stationary, or wherein both barriers 43, 43' rotate in the same direction, however with different velocities.

While specific embodiments of the invention have been described above, it will be appreciated that the invention may be practiced otherwise then as described. The description is not intended to limit the invention.

What is claimed is:

1. A lithographic projection apparatus, comprising:
 a radiation system configured to form a projection beam of radiation from radiation emitted by a radiation source;
 a support configured to hold a patterning device which is to be irradiated by the projection beam to pattern the projection beam;
 a substrate table configured to hold a substrate;
 a projection system configured to image an irradiated portion of the patterning device onto a target portion of the substrate; and
 a channel barrier near the source configured to prevent material emanating from the source from propagating along an optical axis, the channel barrier comprising a center and a number of elongated channel members each having a width direction transverse to the optical axis and a length direction extending generally in the direction of the optical axis, wherein the channel barrier is rotatable around the optical axis, the lithographic projection apparatus further comprising a drive connected to the channel barrier configured to rotate the channel barrier around the optical axis.

2. A lithographic projection apparatus according to claim 1, wherein the center of the channel is placed on the optical axis.

3. A lithographic projection apparatus according to claim 1, wherein the channel members are focused on the radiation source.

4. A lithographic projection apparatus according to claim 1, wherein the channel members are plate-shaped.

5. A lithographic projection apparatus according to claim 1, wherein the channel members located close to the optical axis form a honeycomb structure in a plane perpendicular to the optical axis and extend parallel or substantially parallel to the optical axis.

6. A lithographic projection apparatus according to claim 1, wherein the drive is adapted to rotate the channel barrier at a speed of between 1 and 50 rotations per second.

7. A lithographic projection apparatus to according claim 1, wherein the drive is adapted to rotate the channel barrier at a speed of between 1 and 10 rotations per second.

8. A lithographic projection apparatus according to claim 1, further comprising a supplementary channel barrier mounted near the channel barrier.

9. A lithographic projection apparatus according to claim 8, wherein the supplementary channel barrier is mounted substantially coaxial with respect to the channel barrier.

10. A lithographic projection apparatus according to claim 8, wherein the supplementary channel barrier is rotatably mounted with respect to the optical axis.

11. A lithographic projection apparatus according to claim 10, wherein the supplementary channel barrier has a direction of rotation opposite to the direction of rotation of the channel.

12. A lithographic projection apparatus according to claim 10, wherein the supplementary channel barrier has substantially the same direction of rotation as the direction of rotation of the channel, and has a rotational velocity different from the rotational velocity of the channel.

13. A lithographic projection apparatus according to claim 8, wherein the supplementary channel barrier is non-rotationally mounted.

14. A channel barrier for use in a lithographic projection apparatus, the channel barrier comprising:
 a plurality of elongated channel members each having a width direction transverse to an optical axis and a length direction extending generally in the direction of the optical axis, wherein the channel barrier is configured to be rotatable around the optical axis, the channel barrier further comprising a drive connected to the channel barrier configured to rotate the channel barrier around the optical axis.

15. A method of manufacturing an integrated structure by a lithographic process, the method comprising:
 providing a radiation system configured to form a projection beam of radiation from radiation emitted by a radiation source;
 pattering the projection beam;
 projecting the patterned projection beam onto a target portion of a substrate at least partially covered with a radiation sensitive material;
 providing a channel barrier near the source to prevent material emanating from the source from propagating along an optical axis, the channel barrier comprising a center and a number of elongated channel members each having a width direction transverse to the optical axis and a length direction extending generally in the direction of the optical axis; and
 rotating the channel barrier around the optical axis.

* * * * *